United States Patent
Shih et al.

(10) Patent No.: US 10,061,193 B2
(45) Date of Patent: Aug. 28, 2018

(54) FOCUSED RADIATION BEAM INDUCED DEPOSITION

(71) Applicant: Taiwan Semiconductor Manufacturing Co., Ltd., Hsin-Chu (TW)

(72) Inventors: Hsun-Chuan Shih, Hsinchu County (TW); Sheng-Chi Chin, Hsinchu (TW); Yuan-Chih Chu, New Taipei (TW); Yueh-Hsun Li, Kaohsiung (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 15/917,939

(22) Filed: Mar. 12, 2018

(65) Prior Publication Data

US 2018/0203347 A1    Jul. 19, 2018

Related U.S. Application Data

(62) Division of application No. 14/942,893, filed on Nov. 16, 2015, now Pat. No. 9,915,866.

(51) Int. Cl.
| | | |
|---|---|---|
| *G03F 1/22* | (2012.01) | |
| *G03F 1/26* | (2012.01) | |
| *G03F 1/72* | (2012.01) | |
| *G03F 1/74* | (2012.01) | |
| *G03F 1/82* | (2012.01) | |
| *H01L 21/44* | (2006.01) | |
| *H01L 21/02* | (2006.01) | |
| *H01L 21/321* | (2006.01) | |
| *H01L 21/285* | (2006.01) | |
| *C23C 16/455* | (2006.01) | |
| *C23C 16/04* | (2006.01) | |

(52) U.S. Cl.
CPC .............. *G03F 1/72* (2013.01); *C23C 16/047* (2013.01); *C23C 16/45523* (2013.01); *G03F 1/22* (2013.01); *G03F 1/26* (2013.01); *G03F 1/74* (2013.01); *G03F 1/82* (2013.01); *H01L 21/0262* (2013.01); *H01L 21/02277* (2013.01); *H01L 21/02334* (2013.01); *H01L 21/02337* (2013.01); *H01L 21/02664* (2013.01); *H01L 21/28556* (2013.01); *H01L 21/321* (2013.01)

(58) Field of Classification Search
CPC ..... G03F 1/22; G03F 1/26; G03F 1/72; G03F 1/74; G03F 1/82; H01L 21/02277; H01L 21/02337; H01L 21/02334; H01L 21/28556; H01L 21/0262; H01L 21/02664; H01L 21/321
USPC .............................. 430/5, 313, 315; 438/611
See application file for complete search history.

(56) References Cited

U.S. PATENT DOCUMENTS

| | | |
|---|---|---|
| 8,464,186 B2 | 6/2013 | Wang et al. |
| 8,468,473 B1 | 6/2013 | Wang et al. |
| 8,473,877 B2 | 6/2013 | Wang et al. |
| 8,507,159 B2 | 8/2013 | Wang et al. |
| 8,510,687 B1 | 8/2013 | Liu et al. |
| 8,524,427 B2 | 9/2013 | Shin et al. |
| 8,530,121 B2 | 9/2013 | Wang et al. |
| 8,563,224 B1 | 10/2013 | Chen et al. |
| 8,584,057 B2 | 11/2013 | Liu et al. |
| 8,601,407 B2 | 12/2013 | Wang et al. |
| 8,609,308 B1 | 12/2013 | Chen et al. |
| 8,623,230 B2 | 1/2014 | Auth et al. |
| 8,627,241 B2 | 1/2014 | Wang et al. |
| 8,677,511 B2 | 3/2014 | Wang et al. |
| 8,762,900 B2 | 6/2014 | Shin et al. |
| 8,822,106 B2 | 9/2014 | Wang et al. |
| 8,828,632 B2 | 9/2014 | Wang et al. |
| 8,835,082 B2 | 9/2014 | Chen et al. |
| 8,841,049 B2 | 9/2014 | Wang et al. |
| 8,846,278 B2 | 9/2014 | Shin et al. |
| 8,921,811 B2 | 12/2014 | Knowles et al. |
| 9,147,574 B2 | 9/2015 | Somervell et al. |
| 2007/0281495 A1 | 12/2007 | Mallick et al. |

OTHER PUBLICATIONS

Yu Chia-Hao, et al., U.S. Appl. No. 14/580,463, filed Dec. 22, 2014, entitled "Focused Radiation Beam Induced Thin Film Deposition".
Huth, Michael, et al., "Focused electron beam induced deposition: A perspective", Beilstein Journal of Nanotechnology, 2012, 3, pp. 597-619.

*Primary Examiner* — Christopher G Young
(74) *Attorney, Agent, or Firm* — Haynes and Boone, LLP

(57) ABSTRACT

A method includes loading a mask having a defect into a chamber. The defect of the mask is repaired by forming a repair feature in a repair region of the mask. The forming the repair feature includes irradiating the repair region of the mask with a radiation beam. The forming the repair feature further includes while irradiating the repair region, injecting a precursor gas into the chamber to form a first film of the repair feature on the repair region, and while irradiating the repair region, injecting a cleaning gas into the chamber. The cleaning gas reacts with an impurity material in the first film to transform the first film into a first cleaned film.

20 Claims, 10 Drawing Sheets

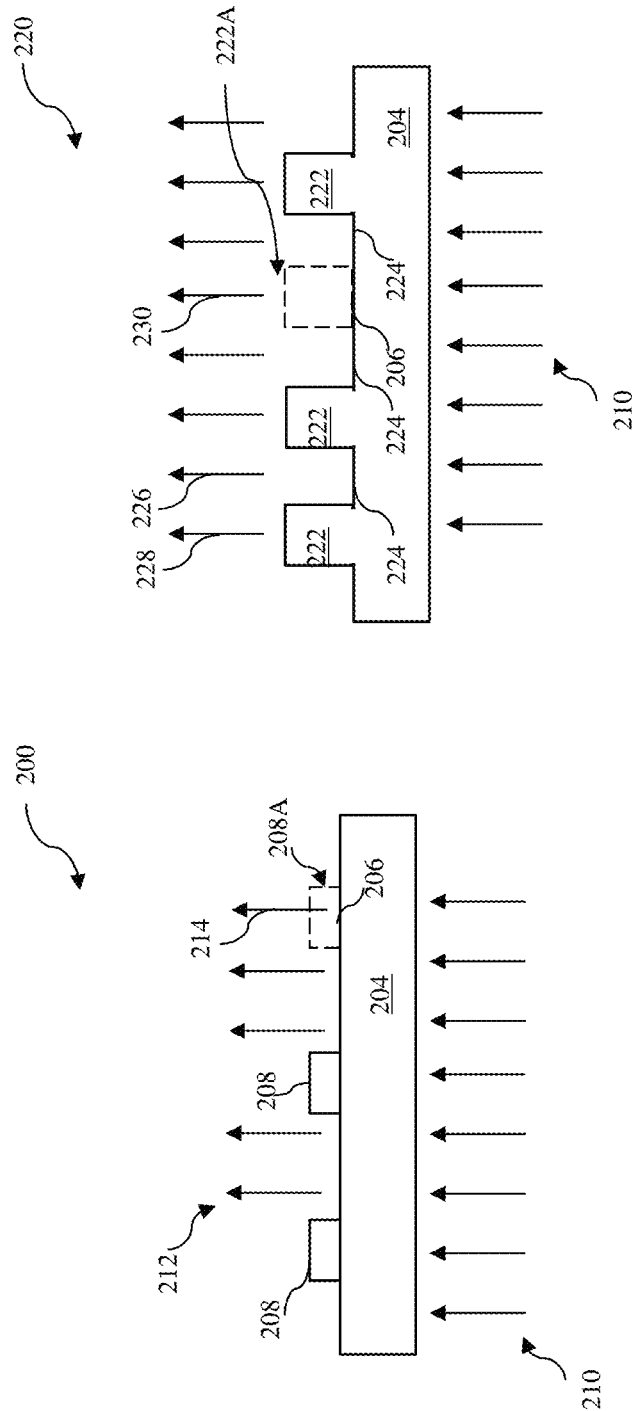

FOCUSED RADIATION BEAM INDUCED DEPOSITION

PRIORITY DATA

The present application is a divisional application of U.S. patent application Ser. No. 14/942,893, filed Nov. 16, 2015, entitled "FOCUSED RADIATION BEAM INDUCED DEPOSITION" issuing as U.S. Pat. No. 9,915,866, which is hereby incorporated by reference in its entirety.

BACKGROUND

In semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

For example, focused ion beam or focused electron beam induced deposition has been used for thin film deposition. In such a method, a precursor gas is introduced near a substrate held in a sealed chamber and a focused ion or electron beam causes the precursor gas to undergo molecular dissociation. Dissociated molecules adsorb onto the surface of the substrate, forming a thin film thereon. Film impurity has been one main disadvantage associated with these techniques. Such impurity results in degradation of finally deposited thin films, and therefore should be avoided.

Therefore, what is needed is an improved focused radiation beam induced deposition method.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B, and 2C are cross-sectional views of a portion of various masks according to some embodiments.

DETAILED DESCRIPTION

Figure 1:
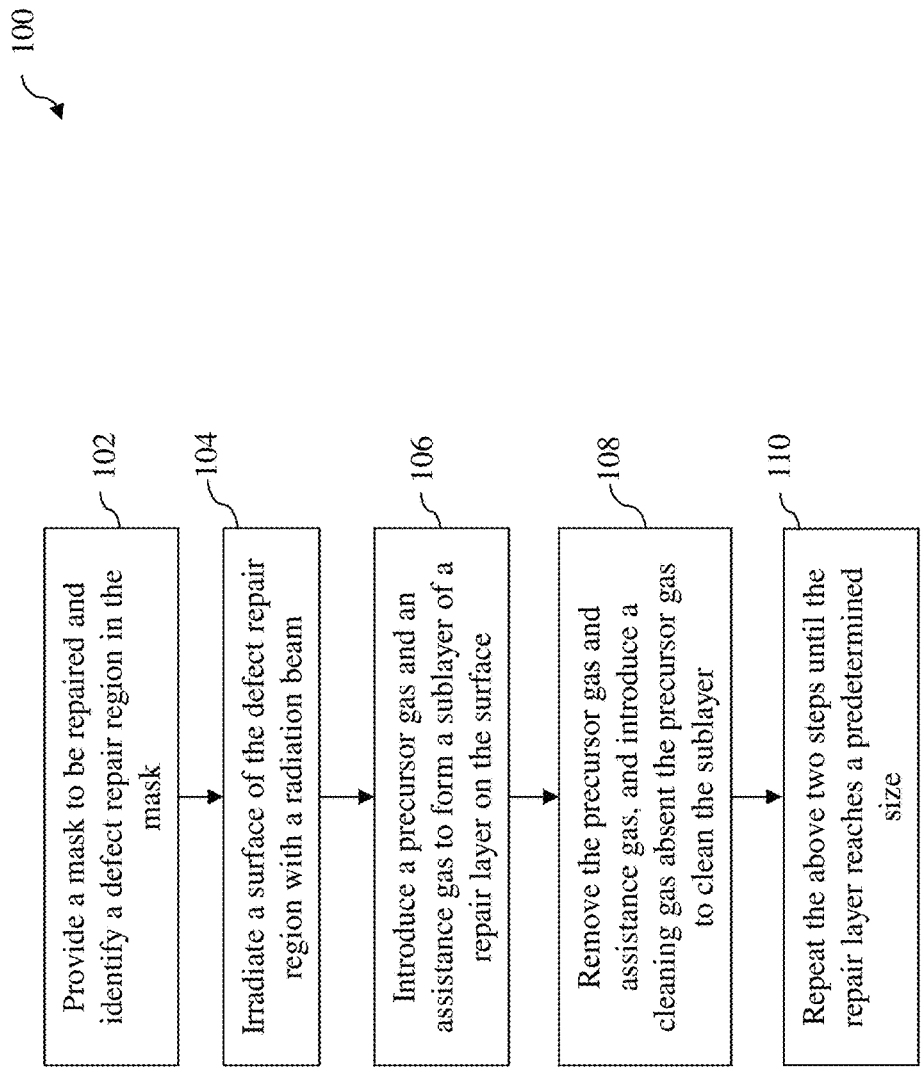
FIG. 1 is a flowchart illustrating an embodiment of a method of repairing a mask according to one or more aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that embodiments of the present disclosure may benefit various semiconductor manufacturing processes including, but not limited to, integrated circuit (IC) fabrication, mask fabrication, and mask repair.

Referring now to FIG. 1, illustrated therein is a flowchart of one embodiment of a method 100 used to repair a mask (also referred to as a photomask). The method 100 begins at block 102 where a mask including a defect is provided. In various embodiments, the mask may be a phase shift mask, a chromeless phase lithography (CPL) mask, a binary mask, a deep ultraviolet (DUV) mask, an extreme ultraviolet (EUV) mask, or other type of masks. A defect repair region may be identified for repairing the defect.

Figure 2C:
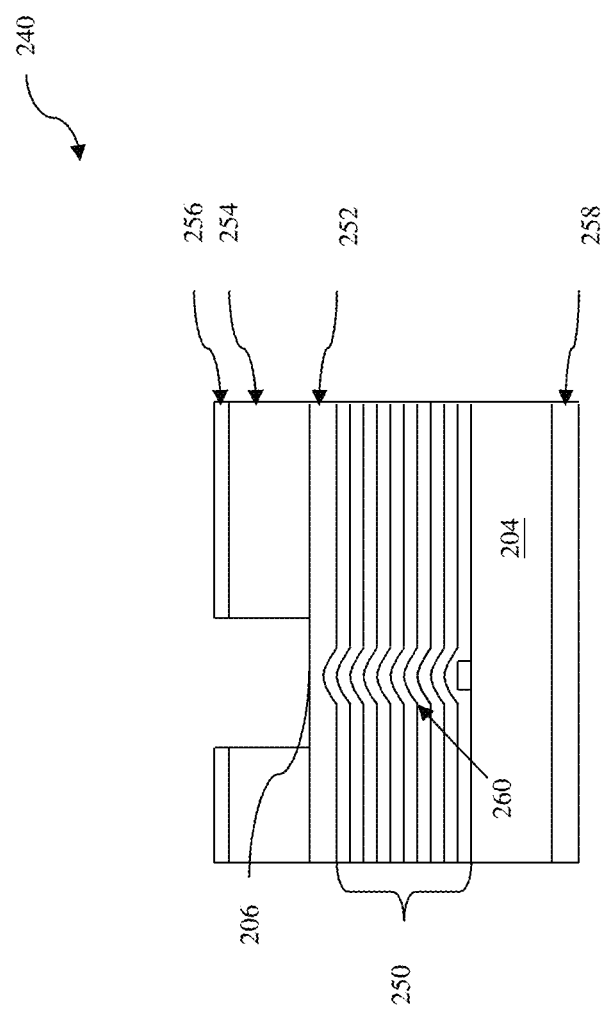

Referring to the examples of FIGS. 2A, 2B, and 2C, in an embodiment of block 102, exemplary masks 200, 220, and 240 having defects are provided, and a defect repair region is identified in each of the masks 200, 220, and 240. Referring now to the example of FIG. 2A, a mask 200 having a defect 208A is provided. In some embodiments, the mask 200 includes a substrate 204 including fused silica ($SiO_2$), fused quartz, calcium fluoride, or other suitable material. In some embodiments, the mask 200 includes an absorber layer 208, which may include a single layer or multiple layers of material selected from the group consisting of chromium (Cr), chromium oxide (CrO), titanium nitride (TiN), tantalum nitride (TaN), tantalum (Ta), titanium (Ti), aluminum-copper (Al—Cu), palladium, tantalum boron nitride (TaBN), aluminum oxide (AlO), molybdenum (Mo), and other suitable materials. The absorber layer 208 may include a material of high purity (e.g., carbon impurity less than 0.1 ppm). In the specific embodiment of the mask 200 shown in FIG. 2A, the absorber layer 208 is patterned according to an IC layout. When an incident radiation 210 is projected onto the mask 200, the patterned absorber layer 208 absorbs the radiation, thereby forming a patterned radiation 212. To further this embodiment, the mask 200 is found to have a defect 208A (also referred to as an absorber pattern defect) where the material in a defect repair region 206 of the patterned absorber layer 208 is missing, and the patterned radiation 212 includes undesirable radiation 214 passing through the defect repair region 206. To repair this defect 208A, a repair feature (e.g., including the same material as the material of the absorber layer 208) may be formed in the defect repair region 206 in subsequent steps according to some embodiments, so that radiation in the defect repair region 206 will be absorbed.

Referring now to the example of FIG. 2B, a CPL mask 220 is provided. In some embodiments, the CPL mask 220 includes a substrate 204 including fused silica ($SiO_2$), fused quartz, calcium fluoride, or other suitable material. In one example, the substrate 204 includes fused quartz of high purity (e.g., with total impurities less than 20 ppm and/or carbon impurity less than 0.1 ppm). In the embodiment of FIG. 2B, the substrate 204 includes a plurality of phase shift regions 224 and non-phase-shifting regions 222 (e.g., including the same material as the material of the substrate 204). The radiation 226 passing through the phase shift regions 224 is phase-shifted by 180 degrees from the radiation 228 passing through the non-phase-shifting regions 222. Circuit features may be formed on a wafer with radiations (e.g., radiation 226 and 228) passing the neighboring regions that are 180 degrees out of phase. To further this embodiment, the CPL mask 220 is found to have a defect 222A where materials are missing in a particular non-phase-shifting region, and the radiation 230 passing through the particular non-phase-shifting region does not have the desired phase (e.g., same as the phase of the radiation 228). To repair this defect 222A, a repair feature (e.g., including the same material as the substrate 204 and/or non-phase-shifting regions 222) may be deposited on a surface of a defect repair region 206 in subsequent steps according to some embodiments, so that radiation passing through the defect repair region 206 will have a phase that is the same as the radiation 228 passing through non-phase-shifting regions 222.

Referring now to the example of FIG. 2C, an EUV mask 240 is provided. In some embodiments, the EUV mask 240 includes a low thermal expansion material (LTEM) mask substrate 204, a reflective multilayer (ML) 250, a buffer layer 252, an absorber layer 254 and a protection layer 256. In addition, a conductive layer 258 may be deposited on a backside of the LTEM mask substrate 204 for electrostatic chucking purposes.

In various embodiments, the LTEM mask substrate 204 may include fused silica ($SiO_2$), fused quartz, calcium fluoride ($CaF_2$), silicon carbide, silicon oxide-titanium oxide alloy and/or other suitable material. The ML 250 includes a plurality of film pairs, such as molybdenum-silicon (Mo/Si) film pairs (e.g., a layer of molybdenum above or below a layer of silicon in each film pair). Alternatively, the ML 250 may include molybdenum-beryllium (Mo/Be) film pairs, or any two materials or two material combinations with large difference in refractive indices and small extinction coefficients. In an example, the ML 250 includes 40 pairs of layers of Mo/Si. Each Mo/Si film pair has a thickness of about 7 nanometer (nm), e.g., about 3 nm for Mo and about 4 nm for Si. The buffer layer 252 may include ruthenium (Ru) or Ru compounds such as ruthenium-boron (RuB) or ruthenium-silicon (RuSi) and acts as an etching stop layer in a patterning or repairing process of the absorber layer 254. The absorber layer 254 absorbs incident EUV radiations projected thereon. The absorber layer 254 may include a single layer or multiple layers of material selected from the group consisting of chromium (Cr), chromium oxide (CrO), titanium nitride (TiN), tantalum nitride (TaN), tantalum (Ta), titanium (Ti), aluminum-copper (Al—Cu), palladium, tantalum boron nitride (TaBN), aluminum oxide (AlO), molybdenum (Mo), and other suitable materials. The protection layer 256 protects the absorber layer 254 from oxidation when the EUV mask 240 is in a cleaning process. In the EUV mask 240 shown in FIG. 2C, the absorber layer 254 is patterned according to an IC layout. When an incident EUV radiation is projected onto the EUV mask 240, the patterned absorber layer 254 absorbs the EUV radiation while the ML 250 reflects the EUV radiation, thereby forming a patterned EUV radiation.

In the example illustrated in FIG. 2C, the EUV mask 240 is found to have an EUV phase defect 260. The phase defect 260, left uncompensated, may distort the patterned EUV radiation. To repair the phase defect 260, a repair feature may be formed on a surface of a defect repair region 206 to repair the phase defect 260 in subsequent steps according to some embodiments.

In various embodiments, impurities in the deposited repair feature may affect various radiation properties (e.g., absorptivity, reflectivity, and/or transmissivity) of the deposited repair feature, thereby affect the patterned radiation (e.g., phase, and/or amplitude) generated by the mask. Thus, in some embodiments, the imaging performance of the mask is improved by reducing the impurities in the deposited repair feature.

Figure 3:
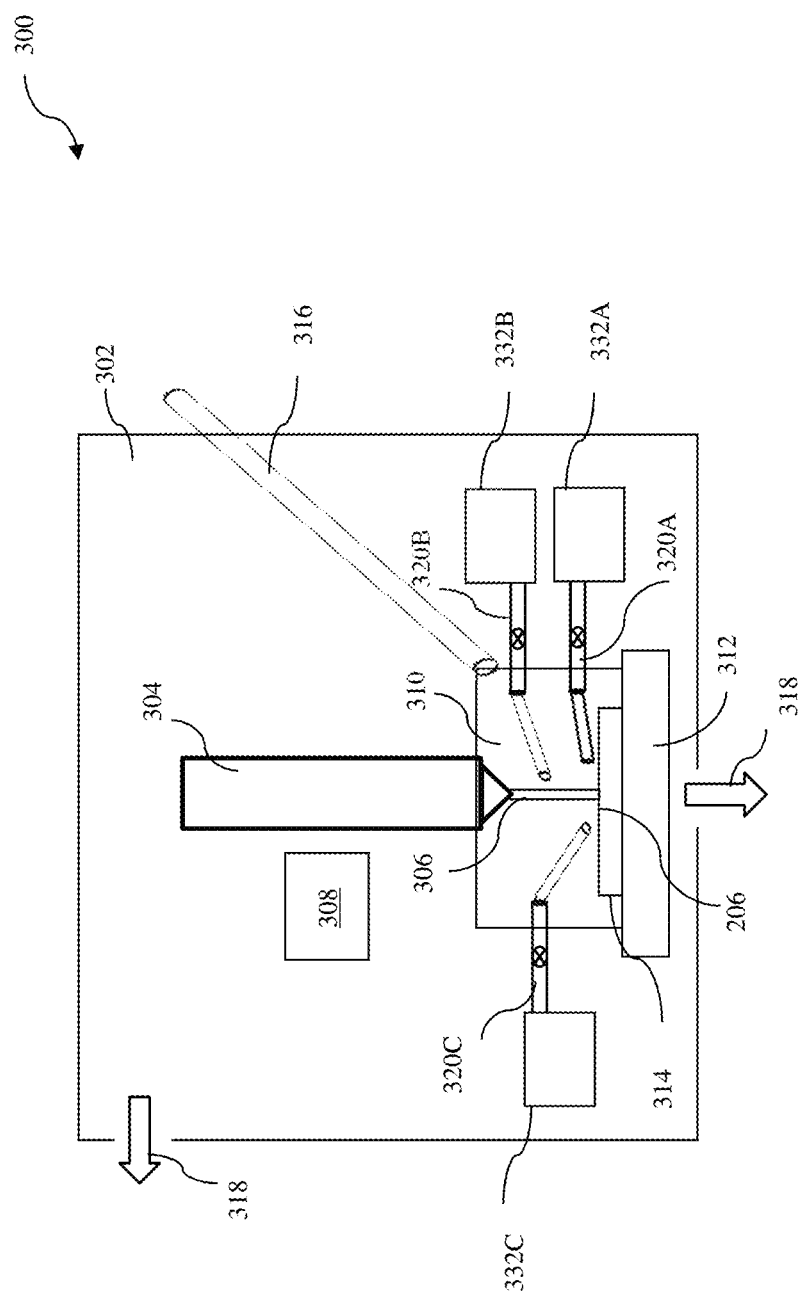
FIG. 3 is a schematic view of a focused electron beam deposition system according to some embodiments.

Referring to FIGS. 1 and 3, the method 100 proceeds to block 104, where a surface of the defect repair region of the mask is irradiated with a radiation beam. Referring now to the example of FIG. 3, a focused beam induced deposition (FBID) system 300 is illustrated. In some embodiments, the FBID system 300 includes a vacuum chamber 302 which houses various components of the FBID system 300; a beam generator 304 that is configured to generate an energetic and focused radiation beam 306; a variable pressure sub-chamber 310; and a stage 312 that is configured to hold a target 314 (e.g., one of the masks 200, 220, and 240) inside the sub-chamber 310. As illustrated in the example of FIG. 3, the FBID system 300 further includes gas inlets 320A, 320B, and 320C that are configured to introduce (or inject) various gases from respective reservoirs 332A, 332B, and 332C into the sub-chamber 310. In various embodiments, the FBID system 300 may include any number of gas inlets and reservoirs to introduce one or more gases. The FBID system 300 may further includes a control module 308, a secondary electron detector 316, and/or a pump system 318. In an embodiment, the control module 308 is coupled to a computer system for controlling the movement of the focused radiation beam 306 relative to the target 314. For example, the radiation beam 306 may be scanned over certain areas (e.g., the defect repair region 206) of the target 314 so that a thin film is deposited with predefined dimensions. In some embodiments, the secondary electron detector 316 may detect and image secondary electrons in the sub-chamber 310. In some embodiments, the pump system 318 may produce and maintain a vacuum in the chamber 302.

In some embodiments, the beam generator 304 includes a focused ion beam gun. For example, positively or negatively charged ions can be generated from a gas, such as hydrogen, helium, carbon, nitrogen, oxygen, neon, argon, krypton, and xenon. Alternatively, in some embodiments, the beam generator 304 includes a focused electron beam gun. For example, electrons can be generated from a conducting material by heating the conducting material to a very high temperature, whereby the electrons have sufficient energy to overcome a work function barrier and escape from the conducting material (thermionic sources). For further example, electrons can also be generated by applying an electric field sufficiently strong so that electrons tunnel through the work function barrier of a conducting material (field emission sources).

In some embodiments, the beam generator 304 further includes various components for condensing, magnifying, and/or directing the radiation beam 306. For example, the beam generator 304 may include condenser lenses, projection aperture, scan coils, objective lenses, and/or other components known in the art. In an example, the beam generator 304 is a tungsten hairpin filament source XL30 environmental scanning electron microscope (ESEM™ from the FEI Company at Hillsboro, Oreg., which may generate an electron beam having energy ranging from about 10 keV to about 300 keV.

In some embodiments, the radiation beam 306 generated by the beam generator 304 is directed onto a surface of the target 314. In various embodiments, the target 314 may be substrate, such as a wafer substrate, a mask substrate, or any other suitable substrate. In the example of FIG. 3, the target 314 is a mask (e.g., any of the masks 200, 220, 240) with a defect repair region 206 irradiated by the radiation beam 306. In some embodiments, the target 314 includes a silicon wafer. Alternatively or additionally, the target 314 may include another elementary semiconductor, such as germanium, a compound semiconductor, an alloy semiconductor, and/or or a semiconductor on insulator (SOI).

In some embodiments, the target 314 is held by the stage 312 inside the sub-chamber 310. The stage 312 may secure the target 314 using vacuum, e-chucking, or other suitable methods, and provide accurate position and movement of the target 314 relative to the radiation beam 306. In an embodiment, the stage 312 includes a plurality of motors, roller guides, and/or tables.

Referring now to FIGS. 1, 3, 4A, 4B, and 4C, the method 100 proceeds to block 106, where a precursor gas and a first assistance gas are introduced to a surface of the defect repair region of the mask to form a sublayer of a repair feature on the surface. Referring to the example of FIGS. 4A, 4B, and 4C, a precursor gas 406 is introduced into the sub-chamber 310 (e.g., using a gas inlet 320A to introduce the precursor gas from a reservoir 332A) near a surface of the defect repair region 206 of the target 314. In some embodiments, the radiation beam 306 focused on the surface of the defect repair region 206 induces dissociation of the gas molecules, and materials are deposited on the surface of the defect repair region 206 to form the sublayer 402. In one example, the radiation beam 306 (e.g., an electron beam) has very high energy (e.g., between about 10 keV and about 300 keV), which may causes the material near the surface of the defect repair region 206 to absorb primary electrons and re-emit secondary electrons having a wide spectrum of energies and angles. Such secondary electrons may cause dissociation of the precursor gas molecules, resulting in a solid deposit on the surface of the defect repair region 206 of the target 314 and volatile by-products in the sub-chamber 310.

Figure 4C:
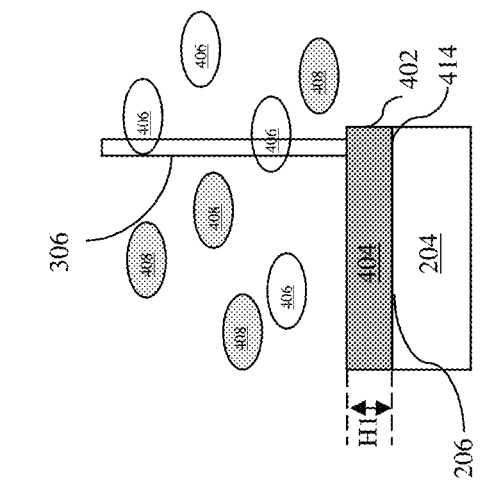
FIGS. 4A, 4B, and 4C are cross-sectional views of a portion of a mask where a first sublayer of a repair feature on a mask is being deposited according to some embodiments.
Figure 4B:
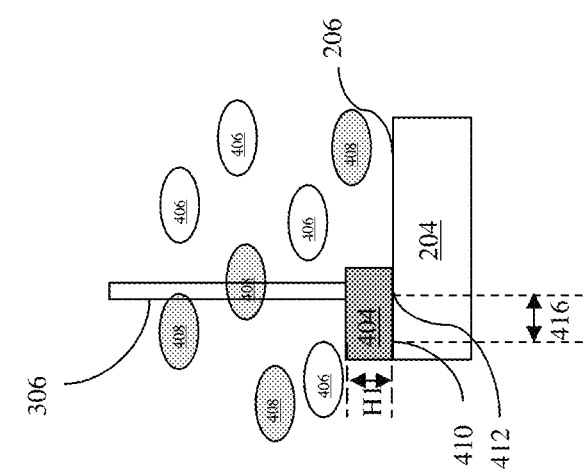
Figure 4A:
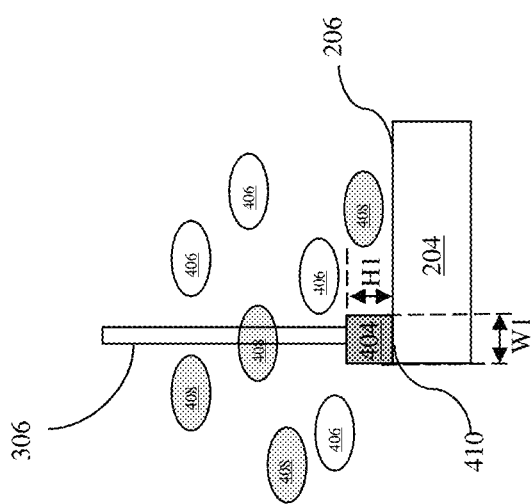

In some embodiments, as illustrated in FIGS. 4A, 4B, and 4C, a first deposition scan process may be performed to form the sublayer 402 on a surface of the defect repair region 206. As illustrated in FIG. 4A, a first deposition step of the first deposition scan process is performed. The radiation beam 306 is focused on the dwell point 410 of the surface of the defect repair region 206 and settles on the dwell point 410 for a predetermined dwell time (e.g., about 1 µs). After the first deposition step is performed, a first material 404 is deposited around the dwell point 410.

As illustrated in the example of FIG. 4B, the first deposition scan process then proceeds to a second deposition step, and the radiation beam 306 is focused on the next dwell point 412 and settles on the dwell point 412 for a predetermined dwell time. In some embodiments, a predefined first dwell point distance 416 extending between the adjacent dwell points 410 and 412 may be determined based on the dimensions (e.g., height H1, deposition step width W1, and/or the profile) of the first material 404 formed by each deposition step. After the second deposition step is performed, the first material 404 is deposited in areas around the dwell points 410 and 412.

Referring now to the example of FIG. 4C, after multiple deposition steps are repeated, the radiation beam 306 is scanned across the surface of the defect repair region 206. The radiation beam 306 is now focused on the last dwell point 414 and settles on the dwell point 414 for a predetermined dwell time. As shown in FIG. 4C, after the first deposition scan process is finished, a sublayer 402 including the first material 404 is formed over the surface of the defect repair region 206.

In some embodiments, the precursor gas 406 is a precursor gas or a mixture of precursor and carrier gases for depositing the sublayer 402 over the surface of the defect repair region 206. For example, the precursor gas 406 may be suitable for depositing a metal film, such as Al, Au, Co, Cr, Cu, Fe, Mo, Ni, Os, Pd, Pt, Rh, Ru, Re, or W. For further example, the precursor gas 406 may be suitable for depositing a dielectric film or a semiconductor compound film, such as GaAs, GaN, Si, $Si_3N_4$, SiOx (e.g., $SiO_2$), or TiOx (e.g., $TiO_2$). In various embodiments, the precursor gas 406 may include $Al(CH_3)_3$, Phenanthrene ($C_{14}H_{10}$), $Co_2(CO)_8$, $Cr(C_6H_6)_2$, $Cr(CO)_6$, $Fe(CO)_5$, $Mo(CO)_6$, $Ni(CO)_4$, $Os_3(CO)_{12}$, Palladium acetate ($Pd(OOCCH_3)_2$), $Ru_3(CO)_{12}$, $Re_2(CO)_{10}$, Tetraethyl orthosilicate (TEOS), $Ti(—OC_3H_7)_4$, $W(CO)_6$, and/or other suitable material.

In some embodiments, some unwanted dissociated elements (also referred to as contaminants or impurities) of the precursor gas 406 remain in the first material 404, and may affect the purity of the first material 404. In one example, the first material 404 of the deposited sublayer 402 may include impurities at a first impurity level (e.g., carbon impurity equal to or greater than 7% by weight).

Referring now to FIGS. 4A, 4B, and 4C, in some embodiments, an assistance gas 408 may be introduced to the surface of the defect repair region (e.g., using a gas inlet 320B to introduce the precursor gas from a reservoir 332B) during some or all deposition steps of the first deposition scan process. The introduction of the assistance gas 408 may serve to reduce impurities. In various embodiments, the assistance gas 408 may be injected (e.g., simultaneously with the precursor gas 406) into the sub-chamber 310 and co-existent with the precursor gas 406. In some embodiments, the gas inlets for the precursor gas 406 and assistance gas 408 may be turned on and/or off at the same time. In some embodiments, the assistance gas 408 may assist the decomposition of the precursor gas 406 and/or lower contaminants in the sublayer 402. For example, the assistance gas 408 may have low dissociation energy, such as less than approximately 50 eV, and can be easily dissociated under the focused radiation beam 306. For further example, the dissociated atoms of the assistance gas 408 may quickly react with the precursor gas 406 to break the chemical bonds thereof, producing highly reactive free radicals. For further example, the assistance gas 408 (and/or the dissociated atoms thereof) may help lower contaminants in the sublayer 402 by reacting with contaminants to form volatile by-products. In an embodiment, the assistance gas 408 is a nitrogen oxide such as nitrogen dioxide ($NO_2$), nitrous oxide ($N_2O$), nitrosylazide ($N_4O$), nitrate radical ($NO_3$), dinitrogen trioxide ($N_2O_3$), dinitrogen tetroxide ($N_2O_4$), dinitrogen pentoxide ($N_2O_5$), and trinitramide ($N(NO_2)_3$). To further this embodiment, the nitrogen oxide molecules, once dissociated, produce highly active free radicals (e.g., NO* and/or O*). The free radicals may promote the dissociation of precursor gas molecules as well as the removal of the dissociated by-products by linking up with them to form evaporable products, thereby improving the purity of the deposited sublayer 402.

In some embodiments, the assistance gas 408 is water vapor ($H_2O$), oxygen ($O_2$), ozone ($O_3$), or a mixture thereof. In some embodiments, the assistance gas 408 is a polarized gas. Polarized gas molecules may adsorb to the surface of the defect repair region 206 longer than neutral gas molecules, thereby providing higher conversion efficiency. In various embodiments, the assistance gas 408 may benefit the deposition of the sublayer 402 where the precursor gas 408 includes carbon atoms.

In some embodiments, various parameters of the first deposition scan process may be controlled so that the sublayer 402 has a desired height H1 and/or width W1. For example, the parameters may include a focal area diameter of the radiation beam 306, the predetermined dwell time of the deposition step, the concentration of the precursor gas 406, the flow rates of the precursor gas 406 and assistance gas 408 (if any) injected into the sub-chamber 310, and/or a time period that the precursor gas 406 and/or assistance gas 408 is introduced (e.g., by turning on and off the gas inlet 320). In some embodiments, the desired height H1 is less than about 5 nanometers (nm) (e.g., in a range of about 2 nm and 5 nm, or less than about 2 nm).

Referring now to FIGS. 1, 5A, 5B, and 5C, the method 100 proceeds to block 108, where the precursor gas and assistance gas (if any) used to deposit the sublayer 402 are removed from the sub-chamber 310, and then a cleaning gas is introduced to a surface of the deposited sublayer 402 to improve the purity of the deposited sublayer 402. In some embodiments, the gas inlets for the precursor gas 406 and/or assistance gas 408 are turned off, and a pump may be used to pump out residual gases (e.g. the precursor gas 406 and assistance gas 408 if any) from the sub-chamber 310.

In some embodiments, after the precursor gas 406 and/or assistance gas 408 is removed, a cleaning gas 504 may be injected (e.g., using the gas inlet 320C and reservoir 332C) into the sub-chamber 310. In some embodiments, the cleaning gas 504 may lower contaminants in the sublayer 402. In one example, the cleaning gas 504 may have low dissociation energy, such as less than about 50 eV, and can be easily dissociated under the focused radiation beam 306. For further example, the cleaning gas 504 (and/or the dissociated atoms thereof) may help reduce a concentration of contaminants within the sublayer 402 by reacting with these contaminants to form volatile by-products. In an embodiment, the cleaning gas 504 is a nitrogen oxide such as nitrogen dioxide ($NO_2$), nitrous oxide ($N_2O$), nitrosylazide ($N_4O$), nitrate radical ($NO_3$), dinitrogen trioxide ($N_2O_3$), dinitrogen tetroxide ($N_2O_4$), dinitrogen pentoxide ($N_2O_5$), and/or trinitramide ($N(NO_2)_3$). To further this embodiment, the nitrogen oxide molecules, once dissociated, produce highly active free radicals (NO* and O*). The free radicals may promote the removal of the contaminants by linking up with them to form evaporable products, thereby improving the purity of the deposited sublayer 402. In some embodiments, the cleaning gas 504 is water vapor ($H_2O$), $O_2$, ozone ($O_3$), or a mixture thereof. In some embodiments, the cleaning gas 504 is a polarized gas. In some embodiments, the cleaning gas 504 may include the same material as the assistance gas 408, and/or the same gas inlet and reservoir may be used to inject the cleaning gas 504 and assistance gas 408. Alternatively, the cleaning gas 504 and the assistance gas 408 are different, and different gas inlets and reservoirs may be used to inject the cleaning gas 504 and the assistance gas 408 respectively.

Figure 5C:
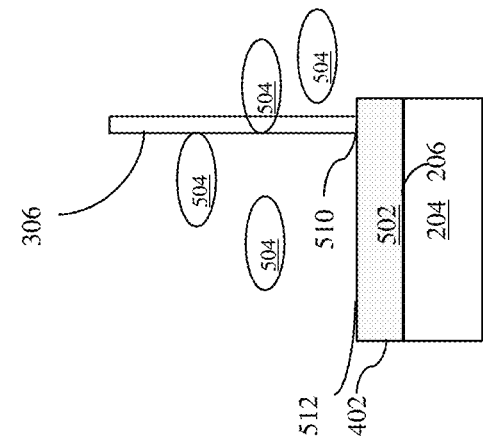
FIGS. 5A, 5B, and 5C are cross-sectional views of a portion of a mask where a first sublayer of a repair feature on a mask is being cleaned according to some embodiments.
Figure 5B:
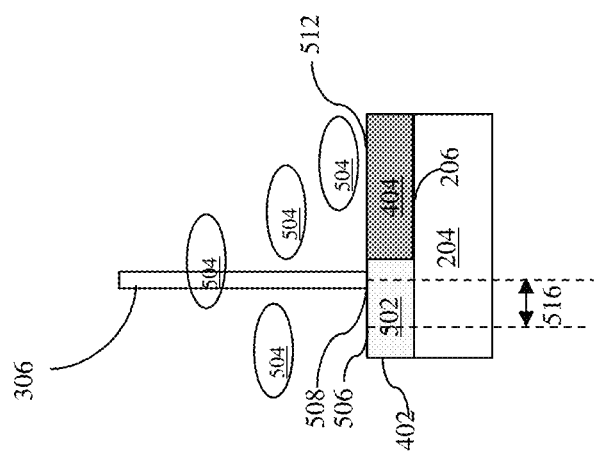
Figure 5A:
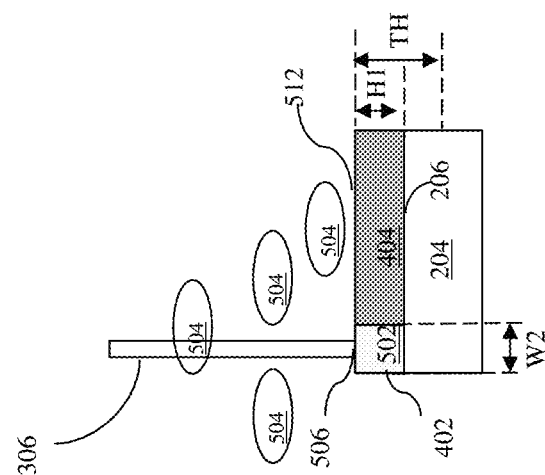

In some embodiments, as illustrated in FIGS. 5A, 5B, and 5C, a first cleaning scan process is performed to clean the sublayer 402 with predefined dimensions. As illustrated in FIG. 5A, a first cleaning step of the first cleaning scan process is performed, and the radiation beam 306 is moved to focus on a dwell point 506 of a surface 512 of the sublayer 402, and settles on the dwell point 506 for a predetermined dwell time (e.g., about 1 µs).

In the example illustrated in FIG. 5A, after the first cleaning step is performed, contaminants in the first material 404 in a first portion of the sublayer 402 with a height H1 and a width W2 around the dwell point 506 may be removed (e.g., by reacting with the dissociated atoms of the cleaning gas 504 to form volatile by-products), thereby transforming the first material 404 in the first portion of the sublayer 402 to a second material 502 having a reduced impurity concentration. In some embodiments, the second material 502 is substantially the same as the first material 404; however, the second material 502 has a lower impurity level than the first material 404.

Alternatively, in some embodiments, the height H1 is greater than a cleaning distance threshold TH, and only a top portion of the sublayer 402 (e.g., with a height TH) may be cleaned by the first cleaning step, and a bottom portion of the sublayer 402 may not be cleaned by the first cleaning step, and remain substantially the same.

Thus, in some embodiments, to uniformly reduce the impurity of the entire sublayer 402, it can be important that the desired height H1 of the sublayer 402 is designed to be equal to or less than the cleaning distance threshold TH. In various embodiments, the cleaning distance threshold TH and/or the width W2 may be affected by a focal area diameter of the radiation beam 306, the predetermined dwell time of the cleaning step, the concentration of the cleaning gas 504 in the sub-chamber 310, and/or a flow rate of the cleaning gas 504 injected into the sub-chamber 310, and/or other parameters known in the art. In some embodiments, various parameters (e.g., the predetermined dwell time, dwell points locations, dwell points distance) of the first cleaning scan process may be different from the parameters of the first depositing scan process. In some embodiments, the cleaning distance threshold TH is equal to or less than about 5 nm (e.g., in a range of about 2 nm and 5 nm, or less than 2 nm), and the desired height H1 is designed to be less than or equal to the cleaning distance threshold TH.

As illustrated in the example of FIG. 5B, the first cleaning scan process then proceeds to a second cleaning step, and the radiation beam 306 is focused on the next dwell point 508 and settles on the dwell point 508 for a predetermined dwell time. In some embodiments, a predefined second dwell point distance 516 extending between the adjacent dwell points 506 and 508 may be determined based on the dimensions (e.g., width W2 and/or the profile) of the second material 502 formed by each cleaning step. After the second cleaning step is finished, the first material 404 in a second portion of the sublayer 402 around the dwell point 508 is transformed to a second material 502 with reduced impurity by removing contaminants in the first material 404.

Referring now to the example of FIG. 5C, after multiple cleaning steps are repeated, the radiation beam 306 is scanned across the surface 512. The radiation beam 306 is now focused on the dwell point 510 and settles on the dwell point 510 for a predetermined dwell time. As shown in the example of FIG. 5C, after the first cleaning scan process is finished, the entire sublayer 402 includes the second material 502 including impurities (e.g., carbon) at a second impurity level (e.g., carbon impurities equal to or less than about 100 ppm by weight) less than the first impurity level of the first material 404. In some examples, the second impurity level is at least less than about 10% of the first impurity level.

Referring now to FIGS. 1, 6A, 6B, 6C, 7A, 7B, 7C, 8A, 8B, and 8C, the method 100 proceeds to block 110, where the two steps of block 106 and 108 are repeated until the repair feature reaches predetermined dimensions. In some embodiments, at block 110, after the first cleaning scan process is finished, it is determined that the repair feature including a single sublayer 402 has reached the predetermined dimensions, and that the process to form the repair feature to repair the mask is completed. Alternatively, as shown in the specific embodiments of FIGS. 6A, 6B, 6C, 7A, 7B, and 7C, after the first cleaning scan process is finished, it is determined that the repair feature including the single layer 402 has not reached the predetermined dimensions (e.g., a predetermined repair feature height 610), and the steps of blocks 106 and 108 are repeated.

In some embodiments, prior to repeating the steps of blocks 106 and 108, the cleaning gas 504 is removed from the sub-chamber 310 (e.g., by a pump). Alternatively, in some embodiments, the cleaning gas 504 is not removed from the sub-chamber 310 prior to repeating the steps of blocks 106 and 108, and may function as an assistance gas during a second deposition scan process.

Figure 6C:
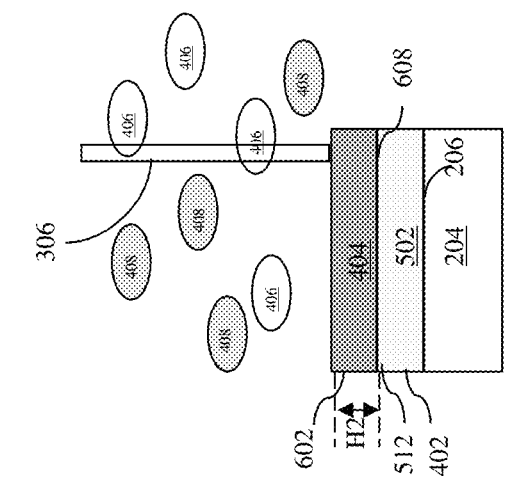
FIGS. 6A, 6B, and 6C are cross-sectional views of a portion of a mask where a second sublayer of a repair feature on a mask is being deposited according to some embodiments.
Figure 6B:
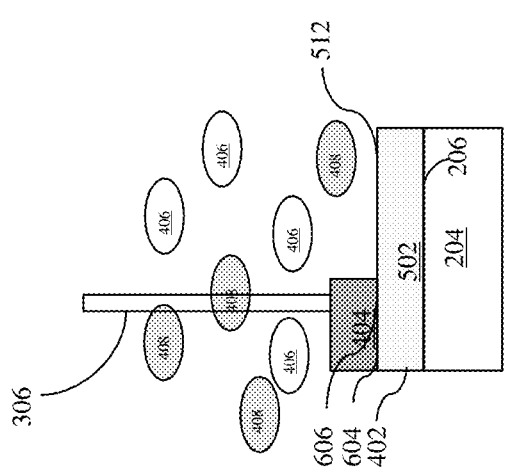
Figure 6A:
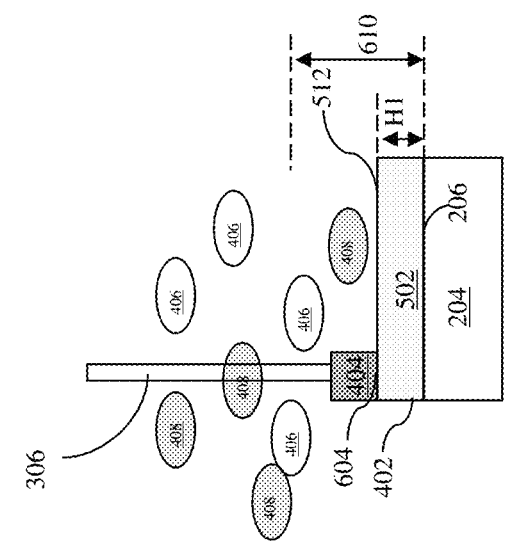

Referring now to the examples of FIGS. 6A, 6B, and 6C, a second deposition scan process is performed on the surface 512 of the sublayer 402 to form a sublayer 602. In some embodiments, the second deposition process may be substantially similar to the first deposition scan process described with respect to FIGS. 4A, 4B, and 4C. Referring to the examples of FIGS. 6A and 6B, the first and second deposition steps of the second deposition scan process are performed on adjacent dwelling points 604 and 606 on the surface 512 respectively, and the first material 404 is deposited on portions of the surface 512 around the dwelling points 604 and 606. Referring now to the example of FIG. 6C, after multiple deposition steps are performed, the radiation beam 306 is scanned across the surface 512 and focused to the dwell point 608 on the surface 512. As shown in FIG. 6C, after the second deposition scan process is finished, a sublayer 602 with a height H2 including the first material 404 is formed over the sublayer 402.

In some embodiments, the sublayer 602 is substantially similar to the sublayer 402, and may have the same predetermined dimensions as the sublayer 402. Alternatively, in some embodiments, the dimensions of the sublayer 602 may be different from the dimensions of the sublayer 402 (e.g., the desired height H2 is different from the desired height H1), and various parameters (e.g., dwell points, dwell time, dwell points distance) of the second deposition scan process may be designed differently from the parameters of the first deposition scan process based on the predetermined dimensions (e.g., the desired height H2) of the sublayer 602.

Figure 7C:
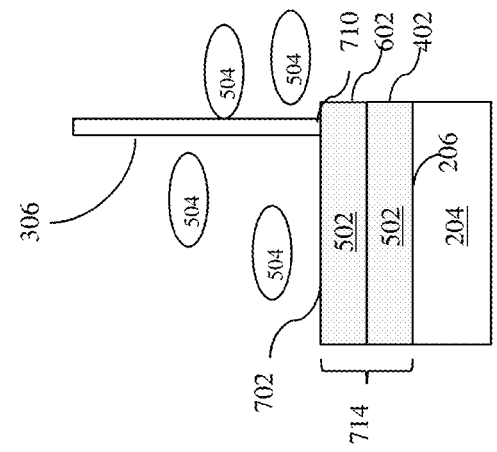
FIGS. 7A, 7B, and 7C are cross-sectional views of a portion of a mask where a second sublayer of a repair feature on a mask is being cleaned according to some embodiments.
Figure 7B:
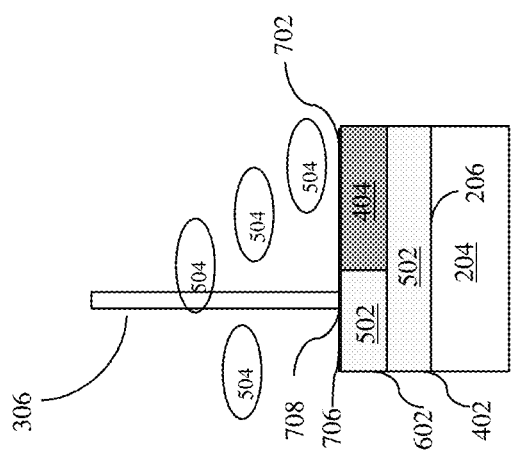
Figure 7A:
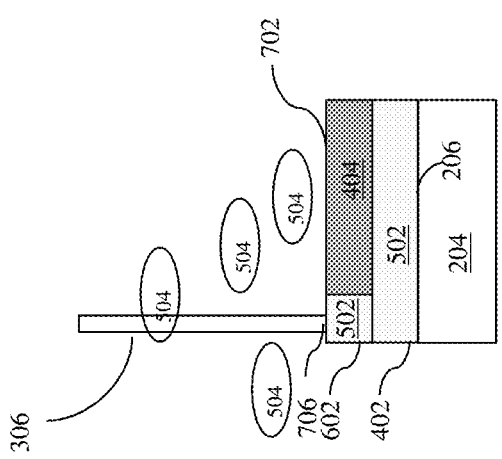

Referring now to FIGS. 7A, 7B, and 7C, a second cleaning scan process is performed on the surface 702 of the sublayer 602 to remove the contaminants in the sublayer 602. In some embodiments, the second cleaning scan process is substantially similar to the first cleaning scan process described with respect to FIGS. 5A, 5B, and 5C. Referring to FIGS. 7A and 7B, the first and second cleaning steps of the second cleaning scan process are performed on adjacent dwelling points 706 and 708 respectively, and the first material 404 in portions of the sublayer 602 around the dwelling points 706 and 708 are transformed to the second material 502 with an improved purity. Referring to FIG. 7C, after multiple cleaning steps are performed, the radiation beam 306 is scanned across the surface 702 and focused on the dwell point 710. As shown in the example of FIG. 7C, after the second cleaning scan process is finished, the first material 404 in all portions of the sublayer 602 is cleaned and transformed to the second material 502. The repair feature 714 now includes sublayers 402 and 602 of the second material 502 with an improved purity.

In some embodiment, various parameters (e.g., dwell points, dwell time, dwell points distance, cleaning distance threshold) of the second cleaning scan process may be different from the parameters of the first cleaning scan process, and may be determined based on the dimensions (e.g., desired height H2) of the sublayer 602. To uniformly reduce the impurity of the entire sublayer 602, it can be important that the desired height H2 of the sublayer 602 is designed to be equal to or less than the cleaning distance threshold of the second cleaning scan process.

Figures 8A, 8B:
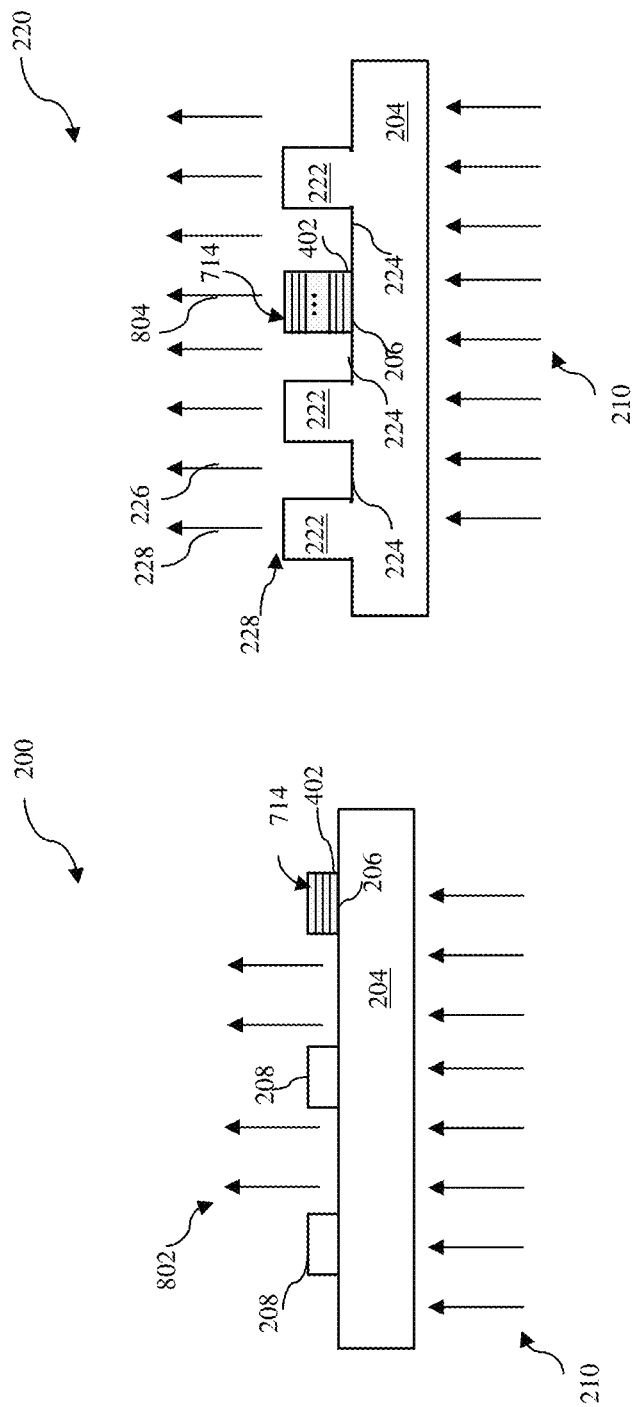
FIGS. 8A, 8B, and 8C are cross-sectional views of a portion of various masks after repair features are formed to repair the masks according to some embodiments.
Figure 8C:
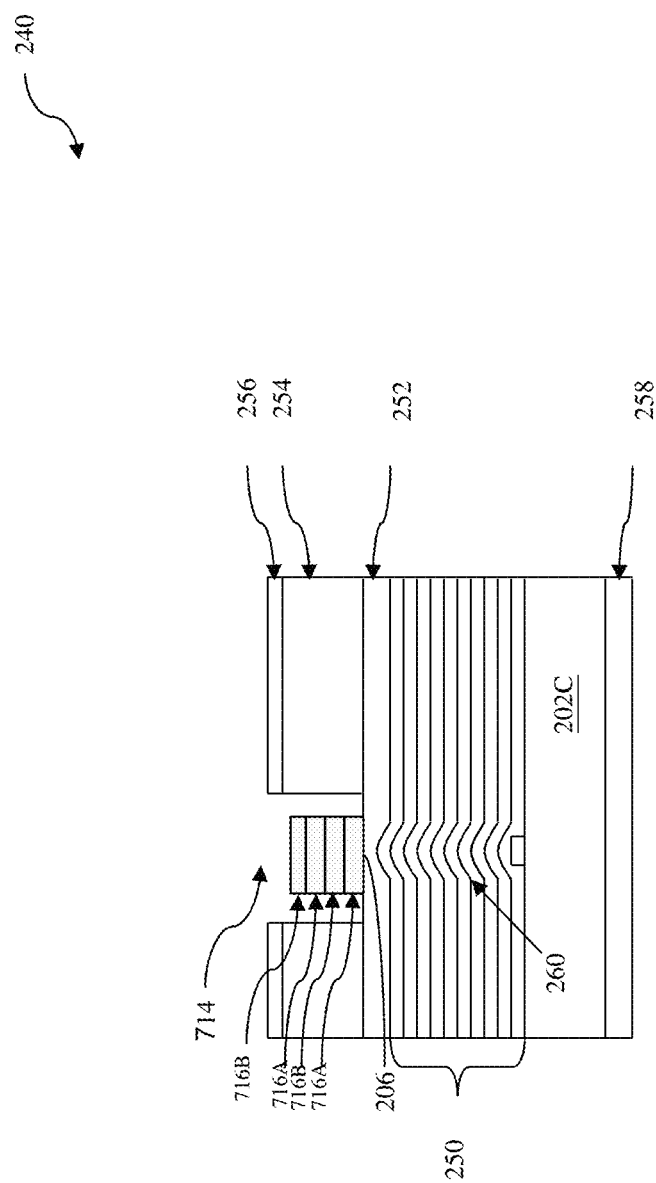

Referring back to FIG. 1, at block 110, the method 100 repeats the steps performed in the blocks 506 and 508 until the repair feature 714 including multiple sublayers reaches predetermined dimensions. Referring now to the examples of FIGS. 8A, 8B, and 8C, illustrated are repaired masks 210, 220, and 240 of FIGS. 2A, 2B, and 2C after a repair feature 714 with predetermined dimensions is formed in the defect repair region 206 of each of the repaired masks according to some embodiments. Referring now to the example of FIG. 8A, a repair feature 714 is disposed in the defect repair region 206 of the repaired mask 200. The material 502 of the repair feature 714 may include the same as the material of the absorber layer 208. When an incident radiation 210 is projected onto the mask 200, the patterned absorber layer 208 and the repair feature 714 absorb the radiation, thereby forming a patterned radiation 802 without any radiation passing through the defect repair region 206. In some embodiments, the second material 502 may have an impurity level (e.g. carbon impurity equal to or less than 100 ppm by weight) that is different from the impurity level (e.g., carbon impurity equal to 0) of the absorber layer 208. In some embodiments, improving the purity of the repair feature 714 may help control the transmittance of the repair feature 714. For example, the repair feature 714 may have a first transmittance that is substantially similar to a second transmittance of the absorber layer 208.

Referring now to the example of FIG. 8B, a repair feature 714 of predetermined dimension is disposed in the defect repair region 206 of the repaired mask 220. When an incident radiation 210 is projected onto the mask 220, the radiation 804 passing through the repair feature 714 disposed in the defect repair region 206 has a first phase. In some embodiments, the repair feature 714 has an impurity level that is different from the impurity level of the substrate 204 and/or the non-phase-shifting regions 222. In some examples, the repair feature 714 has an impurity level that is higher than the impurity level of the substrate 204 and/or the non-phase-shifting regions 222. In some examples, the repair feature 714 has an impurity level that is less than the impurity level of the substrate 204 and/or the non-phase-shifting regions 222. In one example, the difference between the carbon impurity level of the repair feature 714 and the carbon impurity level of the substrate 204 is less than about 1% of the carbon impurity level of the substrate 204. In some embodiments, improving the purity of the repair feature 714 may help control the transmittance of the repair feature and the phase shift caused by the repair feature 714. For example, the first phase and/or first amplitude of the radiation 804 may be substantially similar to a second phase and/or second amplitude of the radiation 228 passing through the non-phase-shifting regions 222.

Referring now to the example of FIG. 8C, a repair feature 714 of predetermined dimensions is disposed in the defect repair region 206 to compensate and repair the phase defect 260 of the EUV mask 240. In some embodiments, the repair feature 714 includes alternating repair layers 716A and repair layers 716B. In one example, the repair layer 714A includes a high index of refraction material (e.g., Mo, $MoO_2$, Cr, W, La, Mg, Ru, or TaBN), and the repair layer 716B includes a low index of refraction material (e.g., Si, TEOS, $B_4C$, SiOZ, Y, or SiC). Each of the repair layers 716A and 716B may include a plurality of sublayers of the respective material formed by the steps of block 106 and block 108. In some embodiments, improving the purity of the repair feature 714 help improve the reflectivity of the repair feature 714 and accurately control the phase shift caused by the repair feature 714, thereby compensate the reflective loss and phase shift caused by the EUV phase defect 260.

The embodiments of the present disclosure offer advantages over existing art, although it is understood that different embodiments may offer different advantages, not all advantages are necessarily discussed herein, and that no particular advantage is required for all embodiments. One of the advantages in some embodiments is that a layer including a high purity material may be accurately deposited by using a focused radiation beam induced deposition process. By forming each of the multiple very thin sublayers (e.g., with a thickness of about 2 nm) of the high purity layer using a sequence including a deposition process followed by a cleaning process, the impurity level in the high purity layer is reduced significantly. Another advantage in some embodiments is that the deposited high purity layer may be used to form repair features to repair defects in masks. The improved purity may help better control various radiation properties of the repair feature, and thereby improving the imaging performance of the repaired masks.

Thus, one aspect of the present disclosure involves a semiconductor device fabrication method. A first surface of a substrate is irradiated with a radiation beam. While irradiating the first surface of the substrate, a precursor gas is introduced near the first surface to deposit a layer including a first material. The precursor gas is removed from near the first surface after the depositing the layer. After the removing the precursor gas and prior to forming another layer over the layer, while irradiating a second surface of the layer, a cleaning gas is introduced near the second surface of the layer to transform the first material into a second material.

Another aspect of the present disclosure involves a method including irradiating a first surface of a substrate with a radiation beam. While irradiating the first surface, a sequence is performed to form a first cleaned sublayer over the substrate. The sequence includes introducing a precursor gas near the first surface of the substrate to deposit a first sublayer and removing the precursor gas from near the first surface after the depositing the first sublayer. The sequence further includes introducing a cleaning gas near the deposited first sublayer to transform the deposited first sublayer into the first cleaned sublayer, and while irradiating a second surface of the first cleaned sublayer, repeating the sequence to form a second cleaned sublayer over the first cleaned sublayer.

Yet another aspect of the present disclosure involves a method including loading a mask having a defect into a chamber. The defect of the mask is repaired by forming a repair feature in a repair region of the mask. The repair region of the mask is radiated with a radiation beam. While irradiating the repair region, a precursor gas is injected into the chamber to form a first film of the repair feature on the repair region. The injection of the precursor gas is stopped after forming the first film. While irradiating the repair region, a cleaning gas is injected into the chamber. The cleaning gas reacts with an impurity material in the first film to transform the first film into a first cleaned film.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   loading a mask having a defect into a chamber;
   repairing the defect of the mask by forming a repair feature in a repair region of the mask, wherein the forming the repair feature includes:
   irradiating the repair region of the mask with a radiation beam;
   while irradiating the repair region, injecting a precursor gas into the chamber to form a first film of the repair feature on the repair region; and
   while irradiating the repair region, injecting a cleaning gas into the chamber, wherein the cleaning gas reacts with an impurity material in the first film to transform the first film into a first cleaned film.

2. The method of claim 1, wherein the forming the repair feature further includes:
   prior to the injecting the cleaning gas into the chamber, stopping the injection of the precursor gas after forming the first film.

3. The method of claim 2, wherein the forming the repair feature further includes:
   after the stopping of the injection of the precursor gas, pumping the precursor gas out of the chamber.

4. The method of claim 1, wherein the forming the repair feature further includes:
   while irradiating the repair region and after the transforming the first film into the first cleaned film, injecting the precursor gas into the chamber to form a second film over the first cleaned film;

stopping the injection of the precursor gas after the forming the second film; and while irradiating the repair region and after forming the second film, injecting the cleaning gas into the chamber, wherein the cleaning gas reacts with the impurity material in the second film to transform the second film into a cleaned second film.

5. The method of claim 4, wherein the forming the repair feature further includes:

forming a plurality of cleaned films by repeating the steps of injecting the precursor gas, stopping the injection of the precursor gas, and injecting the cleaning gas.

6. The method of claim 1, wherein the mask is a chromeless phase lithography (CPL) mask.

7. The method of claim 6, further comprising:

projecting a second radiation beam onto the repaired mask, wherein a first radiation passing through the repair feature disposed in the repair region has a first phase substantially similar to a second phase of a second radiation passing through a second region of the mask.

8. The method of claim 1, wherein the mask is an extreme ultraviolet (EUV) mask.

9. A method, comprising:

loading a mask having a defect into a chamber;

repairing the defect of the mask by forming a repair feature in a repair region of the mask, wherein the forming the repair feature includes:

irradiating a first surface of the repair region with a radiation beam;

while irradiating the repair region, injecting a precursor gas into the chamber near the first surface to deposit a first layer of the repair feature in the repair region, the first layer including a first material;

removing the precursor gas from near the first surface after the depositing the first layer; and while irradiating a second surface of the first layer, introducing a cleaning gas near the second surface of the first layer to transform the first material into a second material.

10. The method of claim 9, further comprising:

inducing a reaction between the cleaning gas and impurities in the first material of the first layer using the radiation beam.

11. The method of claim 9, wherein the second material has a second impurity level less than a first impurity level of the first material.

12. The method of claim 9, wherein the cleaning gas is selected from the group consisting of: nitrogen dioxide (NO2), nitrous oxide (N2O), nitrosylazide (N4O), nitrate radical (NO3), dinitrogen trioxide (N2O3), dinitrogen tetroxide (N2O4), dinitrogen pentoxide (N2O5), trinitramide (N(NO2)3), and oxygen (O2).

13. The method of claim 9, further comprising:

while introducing the precursor gas, introducing an assistance gas near the first surface of the repair region.

14. The method of claim 13, wherein the assistance gas is different from the cleaning gas.

15. The method of claim 13, wherein the assistance gas is the same as the cleaning gas.

16. A method, comprising:

loading a mask having a defect into a chamber;

repairing the defect of the mask by forming a repair feature in a repair region of the mask, wherein the forming the repair feature includes:

irradiating a first surface of the repair region with a radiation beam;

while irradiating the first surface, performing a sequence to form a first cleaned sublayer of the repair feature, wherein the sequence includes:

introducing a precursor gas near the first surface to deposit a first sublayer;

after the depositing the first sublayer, removing the precursor gas from near the first surface; and after the removing the precursor gas, introducing a cleaning gas near the deposited first sublayer to transform the deposited first sublayer into the first cleaned sublayer.

17. The method of claim 16, further comprising:

inducing a reaction between the cleaning gas and impurities in the deposited first sublayer using the radiation beam.

18. The method of claim 17, wherein the impurities include carbon.

19. The method of claim 17, wherein an impurity level of the first cleaned sublayer is at least less than about 10% of an impurity level of the deposited first sublayer.

20. The method of claim 19, further comprising:

while introducing the precursor gas, introducing an assistance gas near the first surface.

* * * * *